United States Patent
DeHaven et al.

(10) Patent No.: US 6,411,116 B1
(45) Date of Patent: Jun. 25, 2002

(54) METHOD FOR TESTING A PRODUCT INTEGRATED CIRCUIT WAFER USING A STIMULUS INTEGRATED CIRCUIT WAFER

(75) Inventors: Robert Keith DeHaven; James F. Wenzel, both of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/511,425

(22) Filed: Aug. 4, 1995

Related U.S. Application Data

(62) Division of application No. 08/298,870, filed on Aug. 31, 1994, now abandoned.

(51) Int. Cl.$^7$ ............................................. G01R 31/28
(52) U.S. Cl. ..................... 324/765; 324/754; 324/760
(58) Field of Search .............................. 324/158.1, 757, 324/754, 760, 765

(56) References Cited

U.S. PATENT DOCUMENTS

| | | | |
|---|---|---|---|
| 4,281,449 A | 8/1981 | Ports et al. .................... 29/293 |
| 4,379,259 A | 4/1983 | Varadi et al. ................. 324/73 |
| 4,467,400 A | 8/1984 | Stopper ....................... 361/403 |
| 4,472,483 A | 9/1984 | Shimamoto et al. ......... 428/447 |
| 4,489,397 A | 12/1984 | Lee ............................ 364/900 |
| 4,503,335 A | 3/1985 | Takahashi ................... 324/760 |
| 4,518,914 A | 5/1985 | Okubo et al. ............... 324/158 |
| 4,519,035 A | 5/1985 | Chamberlain ............... 364/200 |
| 4,523,144 A | 6/1985 | Okubo et al. ............... 324/158 |
| 4,585,991 A | 4/1986 | Reid et al. .................. 324/158 |
| 4,628,991 A | 12/1986 | Hsiao et al. ................ 165/80.4 |
| 4,766,371 A | * 8/1988 | Moriya ........................ 324/763 |
| 4,783,695 A | 11/1988 | Eichelberger et al. ........ 357/65 |
| 4,833,402 A | 5/1989 | Boegh-Petersen ........... 324/158 |
| 4,849,847 A | 7/1989 | McIver et al. ................ 361/88 |
| 4,855,253 A | 8/1989 | Weber ........................... 437/8 |
| 4,884,122 A | 11/1989 | Eichelberger et al. ........ 357/71 |
| 4,918,811 A | 4/1990 | Eichelberger et al. ........ 29/840 |
| 4,937,203 A | 6/1990 | Eichelberger et al. ........ 437/51 |
| 4,956,602 A | 9/1990 | Parrish ....................... 324/158 |
| 4,961,053 A | 10/1990 | Krug ........................... 324/537 |
| 4,967,146 A | 10/1990 | Morgan et al. ............. 324/158 |
| 4,968,931 A | 11/1990 | Littlebury et al. .......... 324/158 |

(List continued on next page.)

FOREIGN PATENT DOCUMENTS

| | | |
|---|---|---|
| EP | 0314481 A1 | 10/1988 |
| EP | WO89/11659 | 5/1989 |
| EP | 0420690 A2 | 9/1990 |
| EP | 0 420 690 A2 | 4/1991 |
| EP | 0523734 A1 | 7/1992 |
| EP | 0 523 734 A1 | 1/1993 |
| JP | 4-262551 | * 9/1992 |
| JP | 7-115113 | * 5/1995 |

OTHER PUBLICATIONS

Intel Corporation, Intel486™DX Microprocessor Data Book, Jun. 1991, pp. 127–141, Order No.: 240440–004.

*Primary Examiner*—Ernest Karlsen

(57) ABSTRACT

A method, apparatus, and circuit distribution wafer (CDW) (16) are used to wafer-level test a product wafer (14) containing one or more product integrated circuits (ICs). The CDW (16) contains circuitry which is used to test the ICs on the product wafers (14). A connection from the product wafer (14) to the CDW (16) is made via a compliant interconnect media (IM) (18). Through IM (18), the CDW (16) tests the product wafer (14) under any set of test conditions. Through external connectors and conductors (20, 22, 24, and 26) the CDW (16) transmits and receives test data, control information, temperature control, and the like from an external tester (104). To improve performance and testability, the CDW (16) and heating/cooling (80 and 82) of the wafers may be segmented into two or more wafer sections for greater control and more accurate testing.

20 Claims, 4 Drawing Sheets

U.S. PATENT DOCUMENTS

| | | | |
|---|---|---|---|
| 5,012,187 A | 4/1991 | Littlebury | 324/158 P |
| 5,014,161 A | 5/1991 | Lee et al. | 361/388 |
| 5,047,711 A | 9/1991 | Smith et al. | 324/158 R |
| 5,059,899 A | 10/1991 | Farnworth et al. | 324/138 |
| 5,070,297 A * | 12/1991 | Kwon et al. | 324/754 |
| 5,089,772 A | 2/1992 | Hatada et al. | 324/158 |
| 5,103,557 A | 4/1992 | Leedy | 29/846 |
| 5,123,850 A | 6/1992 | Elder et al. | 439/67 |
| 5,130,644 A | 7/1992 | Ott | 324/58 F |
| 5,140,405 A | 8/1992 | King et al. | 357/67 |
| 5,172,050 A | 12/1992 | Swapp | 324/158 |
| 5,177,439 A | 1/1993 | Liu et al. | 324/158 |
| 5,206,181 A | 4/1993 | Gross | 437/8 |
| 5,206,585 A | 4/1993 | Chang et al. | 324/158 |
| 5,210,485 A * | 5/1993 | Kreiger et al. | 324/758 |
| 5,219,765 A | 6/1993 | Yoshida et al. | 437/8 |
| 5,239,191 A | 8/1993 | Sakumoto et al. | 257/203 |
| 5,241,266 A | 8/1993 | Ahmad et al. | 324/158 R |
| 5,279,975 A | 1/1994 | Devereaux et al. | 437/8 |
| 5,294,776 A | 3/1994 | Furuyama | 219/209 |
| 5,307,010 A | 4/1994 | Chiu | 324/158 R |
| 5,367,253 A | 11/1994 | Wood et al. | 324/158.1 |
| 5,389,556 A | 2/1995 | Rostoker et al. | 437/8 |
| 5,397,997 A * | 3/1995 | Tuckerman et al. | 324/754 |
| 5,399,505 A | 3/1995 | Dasse et al. | 437/8 |
| 5,440,241 A * | 8/1995 | King et al. | 324/765 |
| 5,497,079 A | 3/1996 | Yamada et al. | 324/754 |
| 5,523,696 A * | 6/1996 | Charlton et al. | 324/758 |
| 5,532,610 A * | 7/1996 | Tsujide et al. | 324/760 |
| 5,701,666 A | 12/1997 | DeHaven et al. | 29/831 |

* cited by examiner

METHOD FOR TESTING A PRODUCT INTEGRATED CIRCUIT WAFER USING A STIMULUS INTEGRATED CIRCUIT WAFER

This is a continuation divisional of application Ser. No. 08/298,870 filed Aug. 31, 1994 now abandoned.

FIELD OF THE INVENTION

The present invention relates generally to test apparatus and methods, and more particularly, semiconductor wafer testing and stimulus.

BACKGROUND OF THE INVENTION

Wafer Level Burn-in consists basically of a sacrificial layer of metal added to the wafer after normal processing has ended. This sacrificial layer of metal is added to provide the required electrical stimulus to the devices on the wafer to exercise functional circuitry providing a level of transistor operation along with elevated temperatures for a period of time determined to stress and detect "early fail" or weak transistors up front before shipping product integrated circuits (ICs). The elevated temperature and electical stimulus accelerates the failure mechanisms associated with certain weak devices. If the device is functional after burn-in, then it contains none of the defects associated with early field reliablity failures. it has passed the point in time that typical early reliability failures will fail in the field (i.e., in customer's systems).

Problems concerning the prior art of sacrificial metal includes additional product wafer processing, removal of sacraficial metal which may cause unforeseen reliability problems, and the wafer after deprocessing is essentially a different product that what was burned-in.

The sacraficial metal layer will require a wafer layer planarization process prior to sacrificial metal deposition to eliminate issues with depth of focus for photoresist exposure and topography which can cause metal-to-metal defects. Typically, final metal deposition with oxide/nitride passivation creates severe topography that may cause metal shorts on the sacrificial metal layer as well as photo resist patterning problems. To improve the sacrificial metal yield, a planarization process is needed to reduce the topographical features. This planarization step is non-typical wafer processing. Vias need to be etched to reach the final metal layer for the sacrificial metal connection. This final metal layer of the product usually contains metal bonding pads. Sacrificial metal is then deposited and patterned to form the bussing network to the individual die. This sacrificial metal layer is then connected to electric stimuli during a high temperature burn-in. After the wafer is burned-in, the sacrificial metal layer has to be etched away to expose the original bonding pad and the wafer is then electrically tested at wafer probe test. All sacrificial metal layer deposition and photoresist application and exposure processes must be done in the IC fabrication facility to eliminate equipment contamination.

Reliability problems may exist due to sacrificial metal removal effects on the last metal bond pads due to metal thinning unless a carefully controlled, timed metal etch process is used. Since the sacrificial metal layer has the same material properties of the final metal bond pad, there is no automatic etch stop. This could affect the wirebond reliability as compared to a device that did not have the sacrificial metal method of wafer level burn-in. Additional reliability problems could exist by the absence of a deposited polyimide stress layer as required for certain types of plastic packages. This process could be added after sacrificial metal removal but in most cases, wafers are not allowed back into the IC wafer fabrication facility once removed due to equipment contamination concerns. The addition of a polyimide layer would have to be done in a relatively dirty environment as compared to the wafer IC fabrication facility conditions and cause reliability concerns due to contamination (sodium, potassium, etc . . . ).

Assuming all of the extra wafer processing and reliability concerns could be overlooked, there is still the fundamental problem that extra processing has occurred to the wafer after burn-in. Essentially, the burned-in wafer has different processing than the finished product after sacrificial metal removal.

Once it has been determined that a sacrificial metal layer burn-in will be used on a product, a test strategy must be designed. This can be accomplished by a couple of methods.

One method is to use complex test circuitry in the burn-in test system. This is costly and maintenance intensive. During the manufacturing/production mode of product lifetime, reliability studies are seldom performed or monitored except at small sample levels. If the test circuitry of the burn-in oven has problems, an IC wafer fabrication lot may not have been burned-in properly which is a reliability issue. In a sample methodology, a relatively small number of devices are removed from each product lot to have a reliability study done. Typically, this reliability study may take several weeks of collecting samples from multiple product lots before a sufficient quantity has been collected to release production equipment to the reliability study. Once a reliability problem has been found with a product lot, it may be several weeks after the product has been shipped to the customer and product recall must occur once the monitored study has been completed. This burn-in methodology has severe product reliability and customer satisfaction issue.

Another method to reduce the burn-in equipment reliability issue is to add additional built-in self test circuitry (BIST). While this method could eliminate some embarrassing problems in product development, it will take up valuable silicon surface area and add cost to each device. Additionally, the extra design resources and time to develop the BIST circuitry may have implications for new product development time to market.

Typical device burn-in has historically been done in a packaged part form. Usually, the burn-in occurs overseas (Malaysia, Thailand, etc.). This is a time consuming process where each individual package unit must be mounted on a burn-in test card and loaded into a burn-in oven. The device must be burned-in and then tested afterwards to see if it is still functional. If the device is non-functional, the part will be discarded and the additional test time and package materials/cost are lost. This could be quite costly for new IC fabrication facility processes depending on the burn-in failure rate due to the relative reliability maturity of the IC fabrication facility process.

Additional problems with the historic approach concern reliability studies. During a monitored burn-in study that typically occurs during new product development, devices have to be removed from the oven at timed intervals (every 6 or 12 hours depending on the accuracy of the study) and tested for functionality. This is a very tedious task and very time consuming thereby allowing for numerous opportunities for error (lost parts, bent package leads, etc. . . ). The time consumed and accuracy during the study could adversely affect time to market and reliability levels for new products. Therefore, a new and more effective/cost efficient way to test ICs is needed.

BRIEF DESCRIPTION OF THE INVENTION

Figure 1:
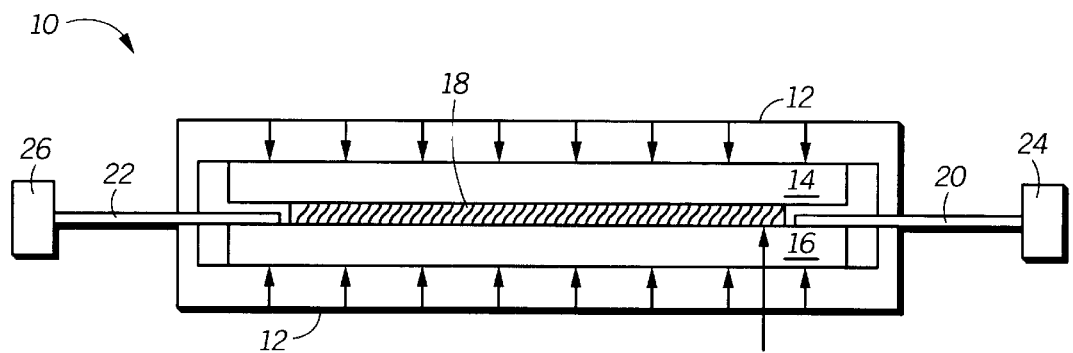
FIG. 1 illustrates, in a cross-sectional diagram, a wafer testing apparatus in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF THE PREFERRED EMBODIMENT

Generally, the present invention provides a method and apparatus for testing a semiconductor product wafer via a circuit distribution wafer or stimulus/test wafer. In another form, the invention comprises a circuit distribution wafer (CDW) used for wafer testing, a method of making this circuit distribution wafer (CDW), and a method of testing the semiconductor product wafer. The circuit distribution wafer comprises novel circuits to perform certain burn-in/test/stimulus operations on the product wafer.

Generally, the wafers, methods, and apparatus taught herein describe a semiconductor wafer-to-wafer test/conditioning scheme utilizing wafer-scale integration to create a re-usable, testable circuit distribution wafer (i.e., test wafer) which conducts electrical bias and stimuli, under various environmental conditions, to and from a product device wafer via a compliant, temporary interconnect medium.

The circuit distribution wafer (CDW) includes active and passive circuitry that may include analog and/or digital circuitry such as a control logic, test logic, Digital Signal Processors, EEPROM, RAM, ROM, filters, Digital to Analog converters, Analog to Digital converters, op amps, microcontrollers, or any other circuitry that may be used to test a product including busses and contact pads.

The product wafer has an exposed upper layer of conductor material which is usually metallic (i.e. aluminum). The circuit distribution wafer (CDW) also has an upper layer of metal conductive material which is coupled to the product wafer selectively via the compliant interconnect media. The interconnect media consists of a permanent or removable elastomer material with imbedded wires made of conducting material such as gold, copper, titanium or any other metal or material that conducts electrical impulses with low or acceptable signal degradation or signal attenuation.

This approach of using a complaint interconnect media between two wafers wherein one wafer is a test wafer testing another wafer under certain conditions allows for electrical testing, conditioning (i.e. burn-in) and monitoring of the product wafer; feedback of wafer temperature and individual device performance; and built-in over-current/voltage safeguards for one, many, or all integrated circuits formed on the product wafer. Attached to the circuit distribution wafer (CDW) at various peripheral locations are external electrical contactors to communicate the test information to an external device for storage, comparison, transmission, or analysis.

To optimize on-wafer power and signal distribution, multiple contactor points can be used on a wafer. The wafers and interconnect media are held in place and in contact with one another via mechanical fixturing which applies a uniform force across the wafers while allowing the external contactors to be routed external to the wafers.

Wafer temperature is independently controlled through temperature feedback circuitry on one or more of the CDW and/or the product wafer to allow for burn-in temperature control that may vary if there are large variations of functional or non-functional devices which may vary from product wafer to product wafer (self heating to a product wafer depending on power consumption and may need cooling instead of heating into to properly test at a temperature).

The need for built-in over-current/voltage safeguards on the CDW occurs when a single or multiple devices are shorted on the product wafer. This will cause excessive power consumption on the wafer and cause local heating or blown fuses on the power supplies to the CDW. The built-in over-current/voltage circuits on the CDW will allow each shorted device on the product wafer to be removed from or turned-off from the power supplies and registered as a failure. Therefore each leaky or overcurrent/overvoltage device is "dead" electrically and is not a test problem for other good devices. Additionally, an open device will be registered as a failure using the current reference or voltage reference compare circuitry. Each device site on the CDW has this capability so that each die of the product wafer can be disconnected from power on an individual basis.

The present invention overcomes many of the disadvantages stated in the background and can be more fully understood with reference to the FIGS. 1–7 herein. FIG. 1 generally illustrates a test apparatus 10. Test apparatus 10 has a chamber 12 having an upper and a lower portion. Chamber 12 is designed to hold a circuit distribution wafer (CDW) 16 and a product device wafer 14. In a preferred form, the wafers 16 and 14 are semiconductor wafers formed from a material such as silicon, silicon on insulator material (SOI), germanium, gallium arsenide, and the like. For best mechanical performance, the two wafers (CDW and product wafer) should be made of the same material or of materials having the same thermal coefficent of expansion. The product wafer is a wafer which contains one or more integrated circuits which are being produced for sale or use in a commercial manner. The integrated circuits of the product device wafer 14 may contain digital and/or analog circuitry as well as other semiconductor compatible devices such as mechanical transducers, micromachines, sensors, lasers, optical devices, and the like. In general, the integrated circuits (ICs) on the product wafer are one or more of microprocessors (MPUs), microcontrollers (MCUs), digital signal processors (DSPs), analog filters, A/D or D/A converters, memory circuits, EEPROMs, EPROMs, flash memories, DRAMs, SRAMs, non-volatile memories, analog circuitry, op-amps, discreet devices, logic circuits, programmable logic arrays (PLAs), read only memories (ROMs), application specific integrated circuits (ASICs), IC peripherals, or any other compatible IC device.

The circuit distribution wafer (CDW) 16 contains a plurality of circuits for testing/stimulating the integrated circuits on the wafer 14. The wafer 14 contains ICs which are usually arranged in some two-dimensional layout (i.e. they are in a row/column layout, for example). Therefore, the wafer 16 contains circuits arranged in a similar or identical two-dimensional layout scheme. If the wafer 14 contains N product ICs, then the circuit distribution wafer contains N test circuits wherein a unique one test circuit tests a unique one product IC. Usually the test circuits are similar or identical in all N cases, but the N test circuits could vary in design so that certain devices are tested in certain manners. It would also be possible to design the wafers 14 and 16 such that more than one test circuit is used to test one product IC or that more than one product IC is tested by one test circuit on wafer 16.

Therefore, the wafer 14 contains ICs to be tested and wafer 16 contains test circuits to allow for testing/burn-in/stimulation of ICs on wafer 14. It is the interconnect media (IM) 18 which electrically couples the wafers 14 and 16 to one another. The wafers 14 and 16 are formed having a top exposed layer of conductive material. Usually, integrated circuits are formed having conductive layers such as metal, refractory metal, silicides, salicides, polysilicon, amorphous silicon, epitaxial silicon, and the like. Usually, metal layers such as aluminum, copper, gold, solder bumps, or the like form the top-most layers of an IC. These layers are isolated from each other via a dielectric layer and connected to one another via contact holes, vias, or interconnects. The topmost layer of the ICs are exposed to the ambient so that wires or other conductive media of an IC package or circuit board can be attached to the IC to allow the IC to communicate with the external world.

The wafers 14 and 16 are placed in the chamber 12 such that the top-layers of metal face one another. The interconnect media (IM) 18 is formed of any material which can couple these top conductive layers of wafers 14 and 16 together while not electrically short circuiting adjacent isolated contacts of either wafer 14 or wafer 16. One class of material which may be used as the IM 18 involves elastomer material. Typically, small fibers or rods of metal or conductive material are placed in some vertical manner/pattern through space and then surrounded in an elastomer dielectric material. In other forms the metal rods are positioned into the elastomer material to form the interconnect media (IM) 18. Generally, the interconnect media is a dielectric or elastomer material which contains multiple "hair-like" conductive paths which connect through the elastomer material without electrically short circuiting to one another. It is these isolated independent "hair-like" conductors in the IM 18 (see FIG. 1 for an illustration of these conductors) which couple the top metal layers of each wafer 14 and 16 together in a manner which is nondestructive and avoids electrical short circuits. The interconnect media IM 18 has an additional purpose to provide sufficient clearance for the cables 20 and 22 to connect to the CDW wafer 16. Usually, the IM 18 is designed so that it can be subjected to some stress or compression without being adversely affected.

In one form, the IM 18 is made from a material known in the art as an elastomer contactor array incorporating an elastomer material with imbedded conductive material. In general, the IM 18 is referred to herein as a compliant interconnect media wherein a compliant interconnect media is any media or material which can connect the wafers 14 and 16 to one another without significant damage. Usually, the elastomer or compliant interconnect media 18 is "spongy" in nature to avoid undue damage to either wafer 14 or wafer 16. The IM 18 may either be permanently fastened to the wafer 16 or may be designed so that the IM is a piece independent from either wafer 14 or 16.

Although the circuit distribution wafer 16 can contain powerful electronics and circuitry to test or burn-in wafer 14 without significant external aid, it is essential that the circuit distribution wafer (CDW) 16 be coupled to an external controller, computer, memory, or test source to at least supply power. These electrical connectors are illustrated in FIG. 1 via cables 20 and 22. The cables end with connectors 24 and 26. In the art, there are several methods and devices which may be used to couple terminals/conductors to one another in either a serial or parallel manner. Any of these forms of communication will work in FIG. 1. The cables 20 and 22 can each contain one or more conductive wires for communicating with the wafer 16. In addition, the wires in the cables 22 and 20 may either be inputs, outputs, or input/output lines as needed.

Figure 2:
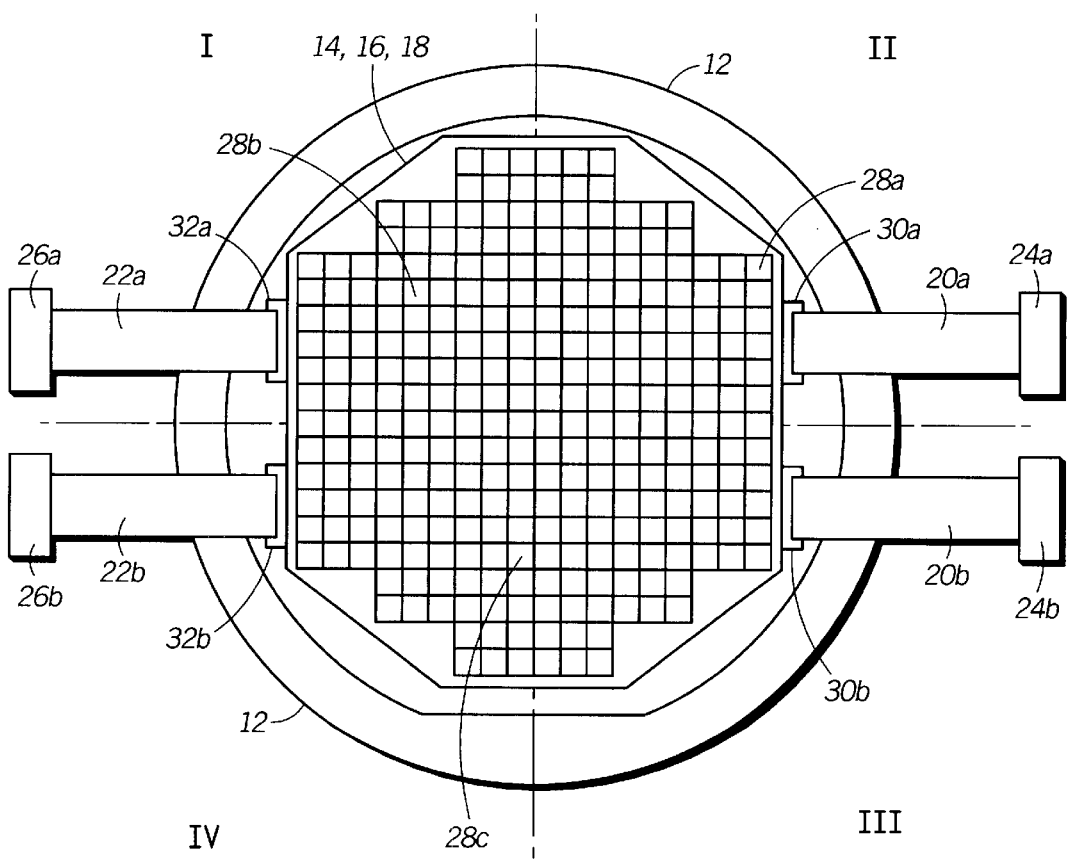
FIG. 2 illustrates, in a top perspective view, the wafer test apparatus of FIG. 2 in accordance with the present invention.

FIG. 2 illustrates a cut away top down view of the structure of FIG. 1 to illustrate the CDW 16 while illustrating the coupling of the communication connector cables 24 and 26 to the wafer contact areas 30b and 32b. In FIG. 2, a top portion of test apparatus 10 is removed, and the product device wafer 14 and IM 18 are not specifically illustrated. The CDW 16 of FIG. 2 is as viewed top down in the chamber 12.

FIGS. 1 and 2 illustrates one or more external contact regions 30a, 30b, 32a, and 32b (in FIG. 2) and each contact region can have one or more input, output, and/or output/input (I/O) terminals. For illustration purposes, there are four contact regions 30a, 30b, 32a, and 32b shown in FIG. 2 (any number of contact regions from one to many are possible) and each contact region serves a portion of the wafer 16 depicted in FIG. 2 as quadrants I, II, III, IV. The purpose for the multiple regions 30a, 30b, 32a, and 32b illustrated in FIG. 2 is so that the test apparatus has the capability to test only part of the wafer at a time to isolate problems or speed path testing. Since each type of product device will have various quantities of die depending on die size and wafer size used, some wafers will use a large amount of external supplied power dependent on average die power consumption used during test or burn-in. To manage the amount of power distributed to the wafer, it may be required to burn-in partial wafers for the required time and then switch to a different wafer quadrant for subsequent time intervals. One big segment (the whole wafer) or any number of segments may be enabled at a time for test purposes. Flexible temperature and circuit control is offered by this segmentation method. If one quadrant has many good die and another is virtually "dead" (few good die), then one quadrant will heat differently than the other quadrant. In some cases, one quadrant may require heating while the other quadrant may require cooling. It should be noted that halves, thirds, quadrants, octants, or any number of segments may be divided up via the method taught above.

Quadrants that had been tested or burned-in will not be re-tested or re-burned-in since cables 20a, 20b, 22a, and 22b with their associated connectors 24a, 24b, 26a, and 24b will allow the external test controls to dictate which section of the product wafer 14 will undergo testing or burn-in. The cables 20a, 20b, 22a, and 22b with their associated connectors 24a, 24b, 26a, and 24b can contain one or more input, output, or input/output terminals to control this heating and data transfer of test data. The cables 20a, 20b, 22a, and 22b are connected to the CDW wafer 14 at one end of the cables via regions 30a, 30b, 32a and 32b. These connector contactor regions 30a, 30b, 32a and 32b may be an elastomer type as describe for the IM 18 herein. In other forms, the connector contactor regions 30a, 30b, 32a and 32b are coupled respectively to the cables 20a, 20b, 22a, 22b, respectively via spot bonding, ball bonding, laser irradiation, soldering, or any method which is used to couple wires to one or more contact pads (these methods are well known in the IC packaging art). In another form, the connection from cables 20a, 22a, 24a, and 26a to the CDW wafer 16 may also be spot soldered or spot welded to form the electrical connection to any external electronic control. Also, a socket-type connection may be used so that the connection of the wires to the CDW is not permanent for maintenance advantages.

The CDW wafer 16 has a two dimensional array configured in the exact positions as would the product wafer 14 from FIG. 1. The product die contact sites 28a, 28b, and 28c (only three out of many are labeled in FIG. 2) will contain the required test circuitry to test or burn-in the product wafer 16. The size of the product die contact sites 28a, 28b, and 28c may be the same size or slightly smaller than the actual product die to allow for signal bussing between test dies 28a, 28b, and 28c and the regions 30a, 30b, 32a, and 32b.

Figure 3:
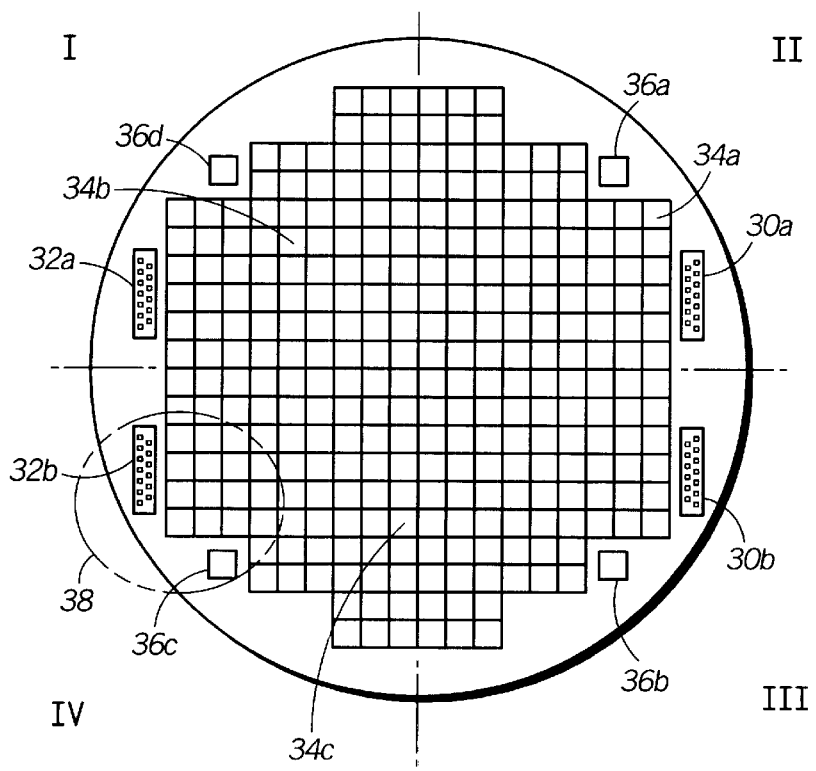
FIG. 3 illustrates, in a top perspective view, a test wafer used to test a product wafer in accordance with the present invention.

FIG. 3 illustrates a top down view of a typical circuit distribution wafer (CDW) or test wafer 16 which was introduced previously in FIGS. 1–2. The product die contact sites 28a, 28b, and 28c will contain the required test circuitry to test or burn-in the produce wafer 16. FIG. 3 illustrates four external contact regions 30a, 30b, 32a, and 32b and each external contact region can have one or more input, output, and/or output/input terminals/pads as illustrated in FIG. 3. For illustration purposes, there are four connector regions 30a, 30b, 32a, and 32b illustrated in FIG. 3, one for each quadrant I, II, III, and IV. In another form, there may be more or less quadrants and/or connector regions dependent on the product wafer 14 design/requirements.

Figure 4:
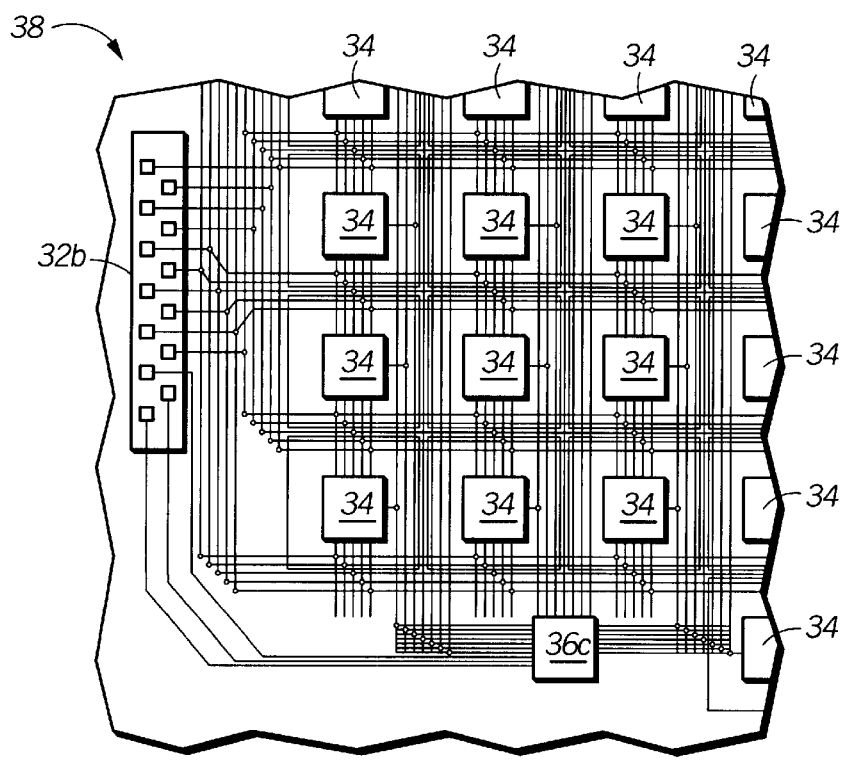
FIG. 4 illustrates, in a magnified top perspective view, a magnified portion of FIG. 3 in accordance with the present invention.
Figure 5:
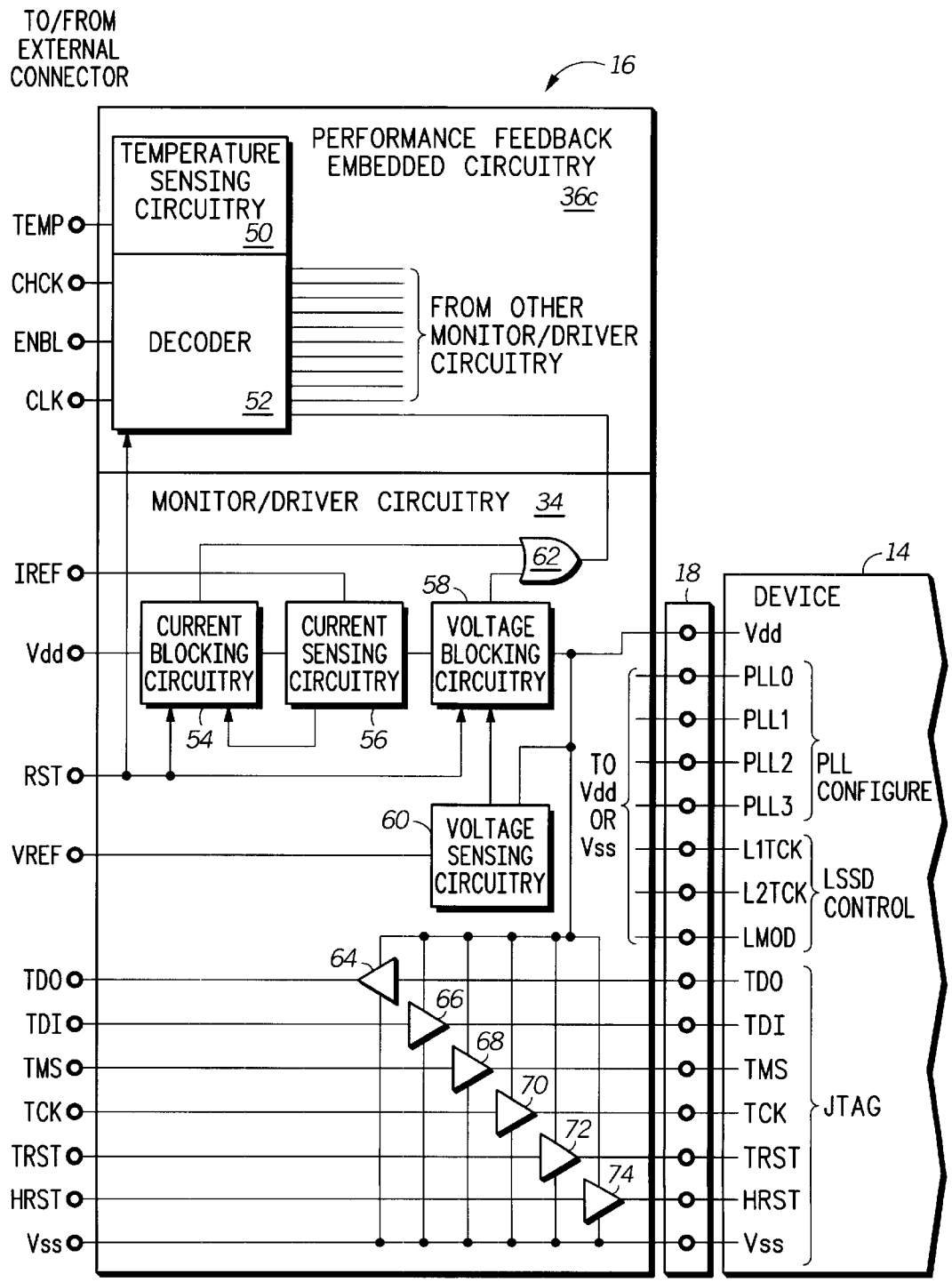
FIG. 5 illustrates, in a block diagram, logical and physical address entries used in FIG. 4 in accordance with the present invention.

The performance feedback embedded circuitry sites 36a, 36b, 36c, and 36d are used to provide monitoring circuitry for temperature sensing and device performance on the CDW wafer and is described in more detail in FIGS. 4 and 5. The feedback embedded circuitry sites 36a, 36b, 36c, and 36d are four circuits on the CDW wafer 14 since four quadrants I, II, III, IV are used. Each quadrant may have one or more performance feedback embedded circuitry sites and these sites may locally collect data for external transmission and be control centers for each test die 34 (i.e. 34a, 34b, 34c are examples of the test die on wafer 16) in it's respective quadrant. Depending on how the CDW wafer 14 is designed, there will be one performance feedback embedded circuitry sites 36a for each sectioning of the CDW wafer 14 in a preferred form. Also, there will be one wafer contact region 30a, 30b, 32a, or 32b for each section of the CDW wafer 14. Area 38 is a portion of FIG. 3 that is magnified and illustrated in more detail in FIG. 4. It is important to note that appropriate redundent/repairable circuitry will be induded in circuits 36a, 36b, 36c, and 36d to ensure 100% yield for the CDW 16.

FIG. 4 illustrates a magnified view of a portion of FIG. 3 referred to as area 38 in FIG. 3. In FIG. 3, the many test dies or test circuits on the area 38 of FIG. 3 are illustrated in a magnified manner. Each test die 34 is coupled to one or more of each other, circuit 36a–36d, and/or one or more pads of regions 30a, 30b, 32a, and 32b. In a manner similar to circuits 36a–36d, the circuitry 34 will contain redundent/repairable circuitry to ensure 100% CDW yeild. The interconnections of FIG. 4 are referred to as on-wafer busses since the interconnections span a substantial portion of the width of the wafer. In other words, these buses are wafer wide and not confined to a single die. In order for a CDW 16 to be fully functional, the entire wafer must operate meaning that a wafer with 100% yield or 100% functionality (no errors) must be formed ideally. This can be done by using known redundancy techniques used in memory design and can be achieved by using a simpler process such as NMOS and/or larger minimum lithography dimensions (example, 1.0 micron to 10 micron minimum size) may be used to increase the likelihood of 100% yield. In addition, since the circuitry of wafer 16 does not typically have as many gates/logic as the product wafer dies on wafer 14, the design rules (transistor separation, closeness of metal busses, contact lithographic misalignment tolerances, etc.) can all be increased when making the CDW 16 to get an improved safety margin and thereby increase yield. In addition, the CDW is tested and optionally repaired to ensure a fully functional wafer.

If 100% (total-wafer) yield cannot be achieved for some reason, then the product wafer 14 can be fully tested by using one or more CDWs 16 wherein no two same die locations on both CDWs 16 are nonfunctional. For example, assume that a first CDW has all even die working and all odd die not working, and that a second CDW has all odd die working and all even die not working. If the product wafer where tested first with the first CDW and subsequently with the second CDW, all product ICs will be tested with the performance loss that two test passes with different CDWs were needed.

FIG. 5 illustrates, in a circuit diagram or a circuit block diagram, the performance feedback or monitoring circuit 36c of FIGS. 3–4, one representative circuit 34 of FIG. 4, the interconnect media 18, and the device under test (DUT) which is one representative IC on product wafer 14. FIG. 5 illustrates that the circuit 36c of FIGS. 3–4 is used per section or quadrant to keep track of data and monitor section/quadrant temperature. Circuit 36c has temperature sensing circuitry 50 which outputs a TEMP signal that is a voltage which can be correlated to a temperature via a correlation algorithm like that which is used for thermocouples. The temperature, via heaters/coolers 80 and 82 from FIGS. 6–7, may be stabilized or changed via the TEMP signal. A decoder 52 in circuitry 36c is used to provide test data to an external tester or computer. The signal CHCK is the serial output of the decoder which has a plurality of inputs from other monitor/driver circuitry on the CDW 16. CHCK provides serial data in a predetermined row/column format based on one of either the product wafer 14 or CDW 16 so that a computer can generate wafer/IC row and column maps of the bad or good die, temperature, current, voltage, speed, and any other test condition. The decoder 52 has an enable signal labeled ENBL and a system clock which is provided by a CLK signal generated by function unit 108 of FIG. 7. Optionally, a clock signal could be generated on the CDW 16.

Each test circuit on the CDW 16 is similar to monitor/driver circuitry 34 in FIG. 5. The current blocking circuitry 54 and current sensing circuitry 56 function together to ensure that any part which is drawing too much current or is leaky in terms of current is shut down so as not to affect adjacent ICs during test. Circuitry 56 receives as input a current reference IREF. If the IC on the wafer 14 which is being tested via the circuitry 34 of FIG. 5 is in an over-current mode (as determined via a comparison to IREF) then circuitry 56 signals circuitry 54 to shut-down the product IC on the product wafer 14. The voltage blocking circuitry 58 and the voltage sensing circuitry 60 operate in a manner similar to circuitry 54 and 56 with the exception that voltage is detected via one or more VREF signals. The VREF signal(s) may be used to ensure that the IC on the wafer 14 does not go above a certain voltage and does not go below a certain voltage. OR gate 62 is used, to signal over-current/over-voltage (or under-current/under-voltage) conditions external to the CDW 16 via the decoder 52, which ICs on the product wafer 14 have been shut down due to one or more of current problems or voltage problems. It is important to note that the Idd and/or Vdd is serially provided and controlled through the circuits 54, 56, and 58 and parallel through circuit 60 before charging the product wafer and before charging the buffers 64–74. Therefore, the buffers 64–74 are not charged if a voltage or current problem is detected to further reduce power during burn-in.

The circuitry 34 of FIG. 5 fully supports the IEEE 1149.1 JTAG test methodology incorporated by reference herein. The signals TDO, TDI, TMS, TCK, TRST, and HRST are well known in the art and explained clearly in IEEE 1149.1. In addition to the signals above, the CDW 16 receives Vss (ground) and Vdd (power) signals for providing power to the product wafer 14. RST is a reset signal for the voltage and current circuitry of circuitry 34 as well a reset signal for the temperature circuitry 50 and the decoding circuitry 52 of circuit 36c. The signals PLL0, PLL1, PLL2, and PLL3 are set to one of either Vdd or Vss via switches (not illustrated in FIG. 5) or direct hardwired connections in circuitry 34 so that the tested IC on the wafer 14 can be run at 1×, 2×, 3×, or 4× of the external clock signal. Routing of Vss and Vdd in circuitry 34 may be programmable to allow test flexibility to PLL configure pins. Therefore, a 10 MHz clock into the system allows the ICs on the wafer 14 to be tested at one or more of 10 MHz, 20 MHz, 30 MHz, and/or 40 MHz via the (phase lock loop) PLL signals in FIG. 5. In addition, any scan chain design implemented in the ICs of product wafer 14 can be operated via the scan chain control signals L1TCK, L2TCK, and LMOD.

Figure 6:
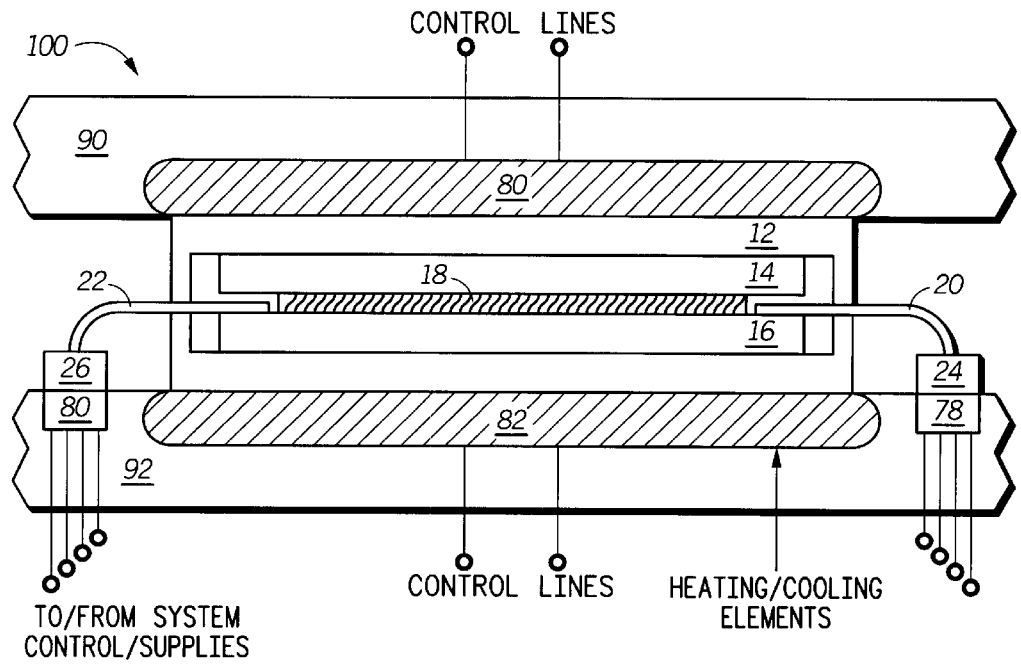
FIG. 6 illustrates, in a cross sectional diagram, a wafer test fixture/chamber in accordance with the present invention.

FIG. 6 illustrates an apparatus which is used to both hold the wafers 14 and 16 and selectively heat or cool one or more of the wafers 14 and 16 for testing. FIG. 6 illustrates the wafers 14 and 16, interconnect media (IM) 18, housing 12, heating/cooling elements 80 and 82 and fixtures 90 and 92. Note that the elements 80 and 82 may be either cooling elements, heating elements, or both heating and cooling elements. The external contactors 24 and 26 which coupled the CDW 16 to the external world are coupled to a contactors 78 and 80 respectively and provide a conductive path for data lines, control lines, and the like. One or more control lines are coupled to each heating element 82 and 80. As discussed herein, the heating/cooling elements, like the wafer 16, may be parsed into multiple sections to effectively heat or cool portions of the product wafer 14 or the CDW 14. As discussed above, heating or cooling elements may not be needed since the current-related self-heating of the product wafer may be sufficient in some cases.

Figure 7:
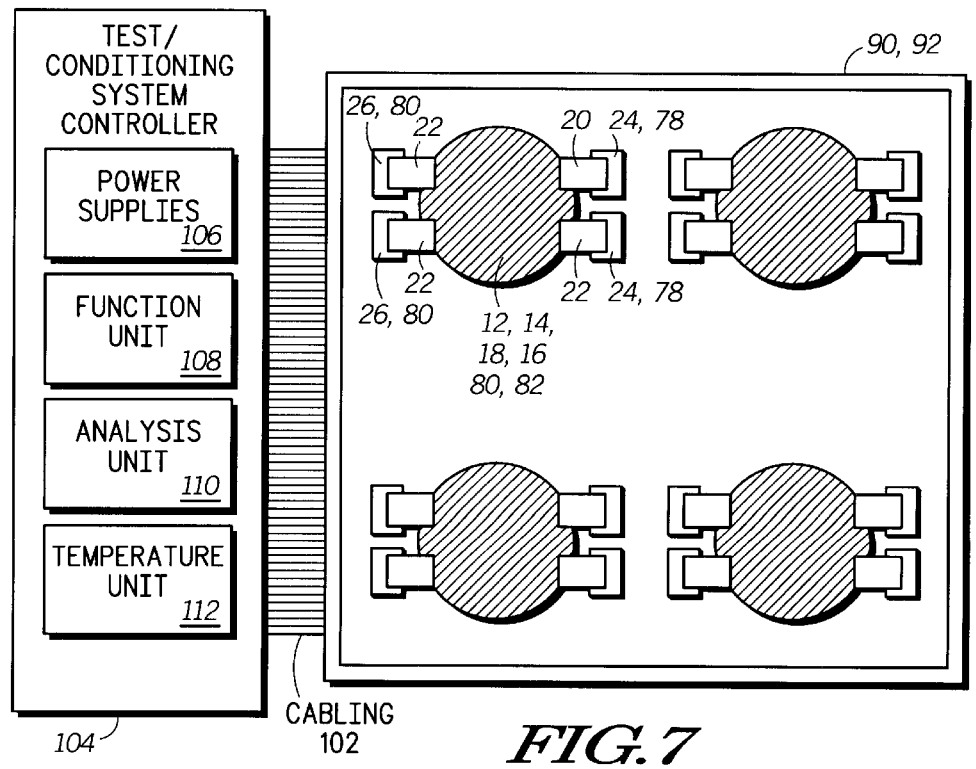
FIG. 7 illustrates, in a block diagram and top perspective view, a multi-wafer test system in accordance with the present invention.

FIG. 7 illustrates an apparatus used to test one or more product wafers 14 using one or more circuit distribution wafers (CDWs) 16 or stimulus/test wafers 16 coupled via an interconnect media (IM) 18. In FIG. 7 the fixtures 90 and 92 have regions which can contain and test one or more wafers via the system illustrated in FIGS. 1–2. In FIG. 7, four units similar to the units illustrated in FIGS. 1–2 are placed into the housing/fixtures 90 and 92. Only one of the four units in FIG. 7 are labeled and any number N of units may be used wherein N is any finite positive integer. The contactors 24 and 26 and cables 20 and 22 couple the four test units to an external tester referred to as a test/conditioning system controller 104 via cabling 102 which contains a plurality of conductors. The controller 104 contains a power supply unit 106 to supply power to the CDWs 16 within fixtures 90 and 92. In addition, the controller 104 has a function unit to test the functionality of the product wafers 14 via the CDWs 16 and IMs 18. In addition, the controller 104 may control the buffers 64–74. An analysis unit 110 is used by the controller 104 to analyze data from the CDWs 16 and the product wafers 16 in order to record data, detect defective ICs, manipulate test data, and the like. A temperature unit 112 in the controller 104 is used to monitor the operating temperature of the product wafers 14 (through circuitry 50 on CDW 16) and/or the CDWs 16 and either flag temperature errors, correct temperature variations over time, or hold the temperature of various segments of the wafers to within a certain test tolerance.

While the present invention has been illustrated and described with reference to specific embodiments, further modifications and improvements will occur to those skilled in the art. For example, by testing a wafer with a CDW before shipping, BIST (built in self test) may be reduced in importance thereby saving substrate area on the product dies. The CDW may test a wafer herein via burn-in, analog or digital testing, built in self test (BIST), overcurrent testing, overvoltage testing, delay path testing, stuck at fault testing, and/or any other forms of tests. It may be possible to eliminate wafer probe if a sufficient level of test coverage is attained through the wafer exercise circuitry (e.g., built-in-self-test, JTAG, LSRL, LSSD etc.) on the product wafer 14. Additional function circuit testing can be accomplished via circuitry within circuitry 34. It is to be understood, therefore, that this invention is not limited to the particular forms illustrated and that it is intended in the appended claims to cover all modifications that do not depart from the spirit and scope of this invention.

What is claimed is:

1. A test circuit comprising:

a first plurality of input terminals and a first plurality of output terminals formed on a semiconductor substrate;

a plurality of buffers coupled between the first plurality of input terminals and the first plurality of output terminals on the semiconductor substrate, a portion of the first plurality of output terminals being coupled to a compliant interconnect media wherein the compliant interconnect media is a dielectric material having a plurality of conductive fibers formed therethrough;

a current sensing and blocking circuit for sensing current through one of the first plurality of inputs and electrically disconnecting the one of the first plurality of inputs from the compliant interconnect media if a predetermined current limit is exceeded, the current sensing and blocking circuit being formed on the semiconductor substrate;

a voltage sensing and blocking circuit for sensing voltage through the one of the first plurality of inputs and electrically disconnecting the one of the first plurality of inputs from the compliant interconnect media if a predetermined voltage limit is exceeded, the voltage sensing and blocking circuit being formed on the semiconductor substrate;

a feedback circuit for receiving data from at least one of the voltage sensing and blocking circuit, the current sensing and blocking circuit, and the plurality of buffers, and using this data to provide test information, the feedback circuit being formed on the semiconductor substrate;

a temperature circuit coupled to the feedback circuit, the temperature circuit being used for receiving and processing temperature information, the feedback circuit being formed on the semiconductor substrate.

2. The test circuit of claim 1 wherein the test circuit further comprises:

test circuitry coupled to the compliant interconnect media for sending functional test signals through the compliant interconnect media.

3. The test circuit of claim 1 wherein the plurality of buffers communicate JTAG information through the compliant interconnect media.

4. Test circuitry formed on an entire semiconductor wafer, the test circuitry comprising:

N test circuits for providing test signals through a compliant interconnect media and for monitoring voltage and current provided through the compliant interconnect media, the N test circuit being subdivided into M distinct groups; and M feedback circuits, each of the M feedback circuits monitoring temperature information from a unique one of the M distinct groups.

5. The test circuitry of claim 4 wherein the M feedback circuits process binary control information transmitted across the compliant interconnect media.

6. The test circuitry of claim 5 wherein the binary control information indicates if the compliant interconnect media is coupled to a non-functional integrated circuit or a functional integrated circuit.

7. The test circuitry of claim 4 wherein the N test circuits and the M feedback circuits are inter-coupled via a metallic bus structure which spans a substantial portion of a diameter of the semiconductor wafer.

8. The test circuitry of claim 4 wherein the N test circuits provide a clock signal, a reset signal, and a data input signal to the compliant interconnect media and receive a data output signal from the compliant interconnect media.

9. The test circuitry of claim 4 wherein the N test circuits provide a ground supply voltage and a power supply voltage to the compliant interconnect media.

10. The test circuitry of claim 4 wherein the N test circuits test product integrated circuits on a product wafer wherein the product wafer is coupled to the compliant interconnect media.

11. Test circuitry formed across a semiconductor wafer, the test circuitry comprising:

a plurality of test integrated circuits separated by scribe lines, each test integrated circuit in the plurality of integrated circuits having:

a plurality of input terminals and a plurality of output terminals, the plurality of input terminals comprising a reset signal, a clock signal, and a test data input signal;

a plurality of buffers coupled between the plurality of input terminals and the plurality of output terminals which allow the plurality of output terminals to be selectively disconnected from the plurality of input terminals; and voltage and current blocking circuitry for disconnecting the plurality of input terminals from the plurality of output terminals via the plurality of buffers when one of either a voltage limit or current limit is exceeded in a respective test integrated circuit;

at least one feedback circuit coupled to several test integrated circuits for communicating test and temperature information from the semiconductor wafer to external to the semiconductor wafer; and a compliant interconnect media coupled to the plurality of outputs, the compliant interconnect media being a dielectric material having a plurality of conductive fibers formed through the dielectric material.

12. The test circuitry of claim 11 wherein a product wafer containing product integrated circuits is coupled to the compliant interconnect media so that the plurality of test integrated circuits test the product integrated circuits through the compliant interconnect media.

13. The test circuitry of claim 11 wherein the at least one feedback circuit contains temperature sensing circuitry which detects a temperature of the test circuitry.

14. The test circuitry of claim 11 wherein the at least one feedback circuit contains a decoder for receiving information from a plurality of the test integrated circuits and communicating this information external to the semiconductor wafer.

15. The test circuitry of claim 11 wherein the compliant interconnect media is in contact with a top layer of metal that is exposed on a top surface of the semiconductor wafer, the top layer of metal being coupled to the test integrated circuits.

16. The test circuitry of claim 11 wherein the plurality of test integrated circuits receive the clock signal, the reset signal, the test data input signal, a power supply voltage, and a ground potential, from a plurality of conductive lines that traverse a substantial portion of the semiconductor wafer.

17. The test circuitry of claim 11 wherein the plurality of test integrated circuits contain MOS transistors wherein all of the MOS transistors are N-channel transistors.

18. The test circuitry of claim 11 wherein a product wafer containing product integrated circuits is coupled to the compliant interconnect media for testing via the test integrated circuits, the at least one feedback circuit communicating to an external tester which of the product integrated circuits are functional and which of the product integrated circuits are non-functional based upon testing performed via the test integrated circuits.

19. The test circuitry of claim 11 wherein test integrated circuits provide phase lock loop (PLL) information through the compliant interconnect media.

20. The test circuitry of claim 11 wherein test integrated circuits level sensitive shift design (LSSD) information through the compliant interconnect media.

* * * * *